United States Patent
Fujii

[19]

[11] Patent Number: 6,023,414
[45] Date of Patent: Feb. 8, 2000

[54] DISPLAY DEVICE MOUNTING ARRANGEMENT AND METHOD

[75] Inventor: Takehiro Fujii, Kyoto, Japan

[73] Assignee: Rohm Co., Ltd., Kyoto, Japan

[21] Appl. No.: 09/208,851

[22] Filed: Dec. 10, 1998

[30] Foreign Application Priority Data

Dec. 16, 1997 [JP] Japan ................................. 9-345963

[51] Int. Cl.[7] .............................. H05K 1/11; H05K 1/18
[52] U.S. Cl. ...................... 361/761; 361/768; 361/783; 361/803; 257/88; 257/99; 345/905
[58] Field of Search .................................. 361/761, 764, 361/783, 806, 681, 768, 803; 257/433, 434, 680, 684, 81, 82, 88, 99; 345/33, 34, 55, 82, 905; 349/149, 152, 158; 340/815.44, 815.45; 250/239

[56] References Cited

U.S. PATENT DOCUMENTS 3,991,463  11/1976  Squitieri et al. ..................... 349/149
4,122,479  10/1978  Sugawara et al. ..................... 257/82

*Primary Examiner*—Leo P. Picard
*Assistant Examiner*—John B. Vigushin
*Attorney, Agent, or Firm*—Merchant & Gould PC

[57] ABSTRACT

An arrangement for mounting a display device to a mother board is disclosed. The display device comprises a substrate mounted with a plurality of light sources and having an edge portion formed with a plurality of terminal portions each connected with one of the light sources, and a reflecting case formed with window holes each at a location corresponding to one of the light sources. The mother board is formed with a through hole for receiving the reflecting case, and has a lower surface formed with terminal portions. The display device has the reflecting case fitted into the through hole from a lower surface side of the mother board, with the terminal portions of the substrate electrically connected with respective terminal portions of the mother board.

7 Claims, 8 Drawing Sheets

DISPLAY DEVICE MOUNTING ARRANGEMENT AND METHOD

BACKGROUND OF THE INVENTION

1. Field of the Invention

The present invention relates to an arrangement for mounting to a mother board a display device which comprises a plurality of light sources and a reflecting case formed with window holes each corresponding to one of the light sources, for displaying symbols such as letters by turning on selected light sources. Further, the present invention relates to a method for mounting such a display device to a mother board.

2. Background Art

Conventional display devices of the above type include a seven-segment LED display device in which seven, bar-shaped, light emitting elements are disposed in a pattern of a numeral 8 for displaying a desired numeral. Also included is an eight-segment LED display device which is a seven-segment device added with another light emitting element representing a decimal point. Further included is a dot-matrix type LED display device in which a plurality of dots each made of a light emitting element are disposed in a matrix pattern or displaying a symbol such as a numeral or a character. FIGS. 1 and 2 show a seven-segment LED display device. Not limited by the illustrated display device, any of the above display devices is mounted on a mother board, and is supplied with electric power through the mother board.

As shown in FIGS. 1 and 2, the illustrated display device 1 comprises a substrate 13 having two end portions each formed with a plurality of recesses 12e. The substrate 13 is formed with a plurality of light source pads 12a each mounted by an LED light source 17, and a plurality of wirebonding pads 12b each connected to one of the light sources 17 via a wire 18. Each pair of the light source pad 12a and the wirebonding pad 12b is formed as a continuous wiring pattern reaching one of the recesses 12e each formed with a terminal portion 12c made of a conductive material. Conventionally, with the above arrangement, mounting of the display device 1 to a mother board 2 is made as shown in FIG. 8. Specifically, the display device 1 is lowered onto the mother board 2, and each of the terminal portions 12c is bonded to a terminal portion in the mother board 2 by solder H for example. More specifically, each of the terminal portions 12c of the diasplay device 1 or each of the terminal portions of the mother board 2 is coated with solder in advance, then the display device 1 is aligned with and lowered on the mother board. Next, the solder H is re-melted, and then cooled to solidify.

However, as clearly shown in FIG. 8, the display device 1 projects out of a surface of the mother board 2, posing problems to be described below.

Specifically, when the mother board 2 is to be assembled to an apparatus, the apparatus must be designed taking the thickness of the projecting display device 1 into consideration. The apparatus must be large enough to include the projection by the display device 1, which goes against a market demand for a thinner product. Further, when handling the mother board 2, the display device 1 is apt to interfere with other members or components to the extent that the display device 1 projects out. Thus, the display device is more susceptible to external impact, and should there be such an external impact, prone to a trouble such as a shorted circuit between the mother board 2 and the display device 1.

DESCLOSURE OF THE INVENTION

It is therefore an object of the present invention to provide an arrangement and a method for mounting a display device for reduced overall thickness when mounted to a mother board, as well as for reduced handling difficulty.

According to a first aspect of the present invention, an arrangement for mounting a display device comprising the following is provided.

Specifically, this arrangement is an arrangement for mounting to a mother board a display device comprising a substrate mounted with a plurality of light sources and having an edge portion formed with a plurality of terminal portions each connected with one of the light sources, and a reflecting case formed with window holes each at a location corresponding to one of the light sources.

The mother board is formed with a through hole for receiving the reflecting case, having a lower surface formed with terminal portions, and the display device has the reflecting case fitted into the through hole from a lower surface side of the mother board, with the terminal portions of the substrate electrically connected with respective terminal portions of the mother board.

According to a preferred embodiment, the substrate of the display device has at least a portion extended from an edge of the reflecting case for being held by an edge portion of the through hole.

According the preferred embodiment, the terminal portions are formed in the extended portion, the substrate is electrically connected with the lower surface terminal portion of the mother board by solder, and the display device is mechanically held to the mother board by this solder.

According to a second aspect or the present invention, a method for mounting a display device to a mother board is provided. The display device comprises a substrate mounted with a plurality of light sources and having an edge portion formed with a plurality of terminal portions each connected with one of the light sources, and a reflecting case formed with window holes each at a location corresponding to one of the light sources. The substrate further has at least a portion extended from an edge of the reflecting case, the reflecting case is inserted into the through hole, with a display surface of the display device facing outward from the through hole, and the extended portion of the substrate holds the display device at an edge portion of the through hole for performing the rest of the mounting operations.

Other features and advantages of the present invention will become clearer from the following detailed description to be made below with reference to the attached drawings.

DETAILED DESCRIPTION OF PREFERRED EMBODIMENTS

Preferred embodiments of the present invention will be described here below with reference to the accompanying drawings. It should be noted that display devices according to the present embodiments are seven-segment display devices.

Figure 1:
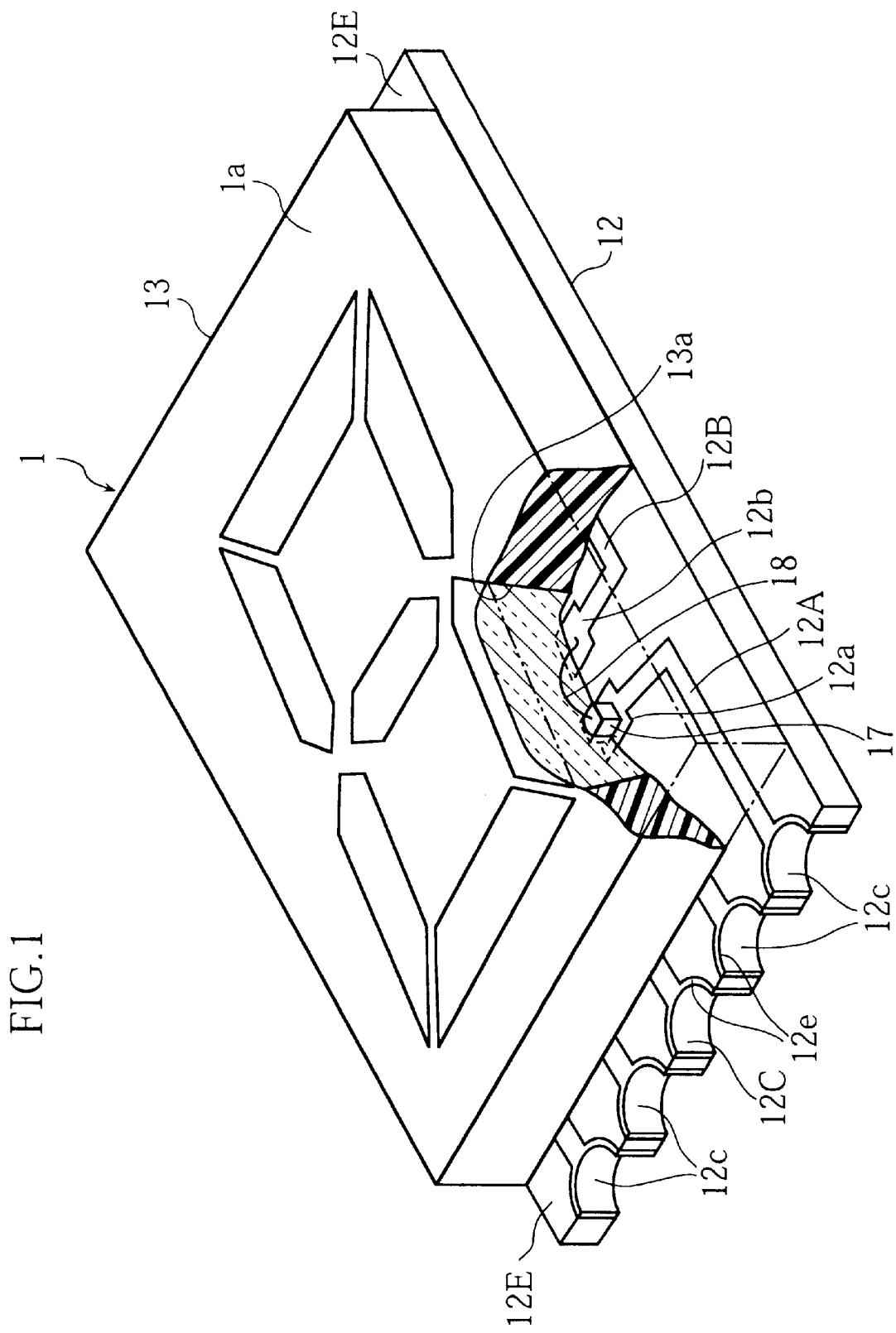
FIG. 1 is a perspective view with a partial section of a display device used in an arrangement for mounting a display device according to the present invention.
Figure 2:
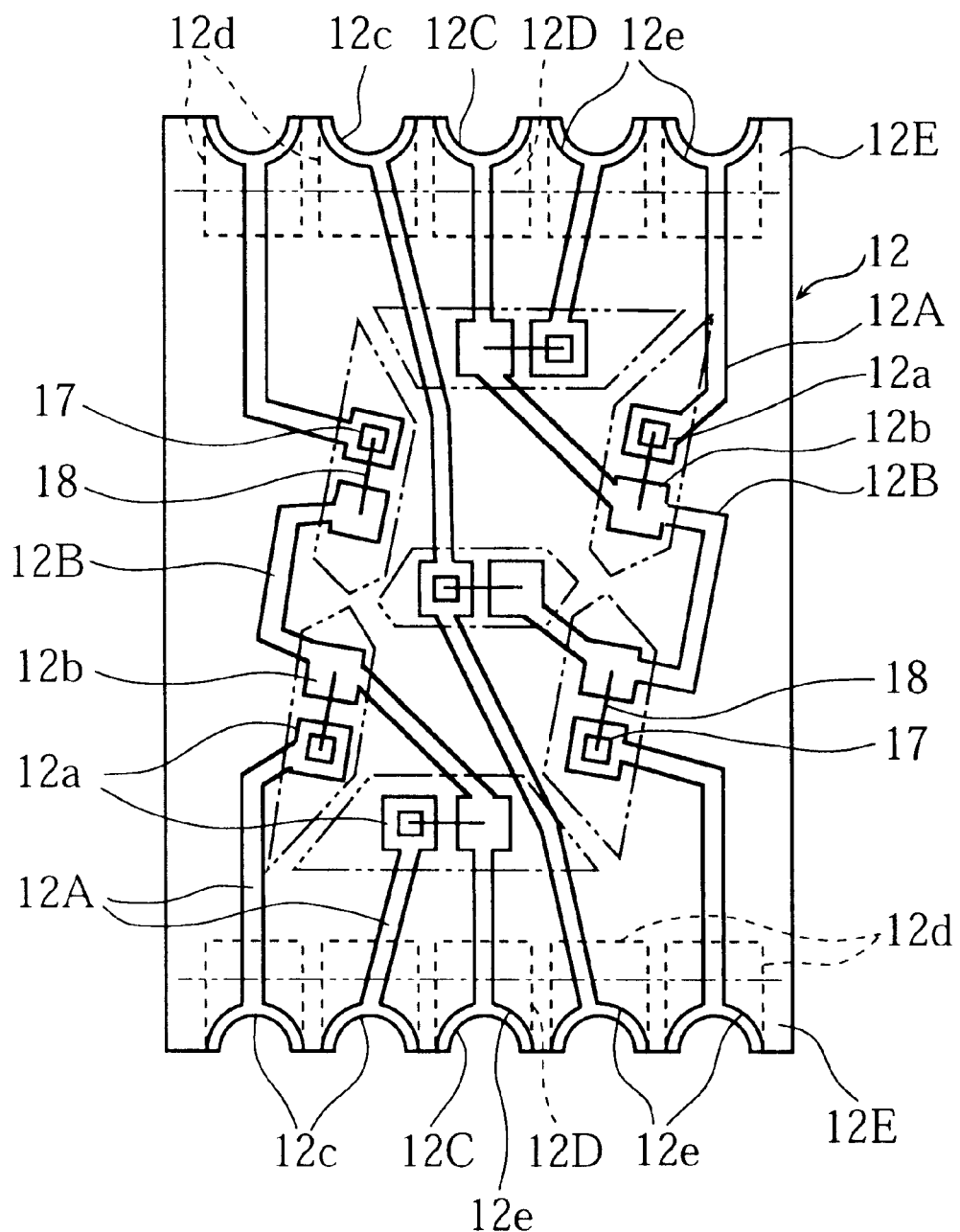
FIG. 2 is a plan view illustrating a wiring pattern of the above display device.

Referring first to FIGS. 1 and 2, a display device 1 generally comprises a rectangular substrate 12 mounted with light sources 17, and a reflecting case 13 attached to an upper surface of the substrate 12. The substrate 12 has two end portions 12E each extended from a corresponding side edge of the reflecting case 13.

As clearly shown in FIG. 1, the reflecting case 13 is formed with seven window holes 13a each corresponding to one of the light sources 17 mounted in the substrate 2. The window holes 13a are disposed in a pattern of a numeral 8. The reflecting case 13 is made of a whity resin for example, so as to give efficient irregular reflection to the light from the light sources 17. Further, each of the window holes 13a is filled with a transparent resin such as an epoxy resin, and an outer surface of the reflecting case 13 is coated in a dark color for clear visibility of the segments when corresponding light sources 17 are turned on. Further, the upper surface of the reflecting case 13 may be attached with a half mirror (not shown). The half mirror may be made of a transparent sheet of synthetic resin vaporized with a metal such as aluminum, silver or chromium.

As clearly shown in FIG. 2, the substrate 12 is rectangular as seen from above, and is made of an insulating material such as a ceramic. Each of the two end portions 12E of the substrate 12, which is the portion uncovered by the reflecting case 13, is formed with five semi-circular recesses 12e. The substrate 12 has an upper surface formed with seven pairs of a light source ad 12a mounted by one of the light sources and a wirebonding pad 12b connected with the above light source via a wire 13.

Each of the light source pads 12a has a predetermined wiring portion 12A which connects with a corresponding conductive portion 12c formed to cover the surface of the recess 12e. Each of the wirebonding pads 12b gathers into a group of three or a group of four each sharing a wiring portion 12B, and then both of the two groups connects with a conductive portion 12C. Each of the conductive portions 12c, 12C extends onto a lower surface of the substrate 12 to form respective lower surface terminal portions 12d, 12D. Specifically, the conductive portion 12c and the lower surface terminal portion 12d each serves as an individual terminal portion for supplying power to a corresponding one of the light sources 17, whereas the conductive portion 12C and the lower surface terminal portion 12D each serves as a common terminal portion for grounding each of the light sources 17. These terminal portions 12C, 12c, 12D, 12d are formed in the extended end portions 12E. It should be noted here that each of the pads 12a, 12b and the wiring portions 12A, 12B can be made by first forming a thin film of conductive metal such as copper, and then etching the thin film.

The display device 1 arranged as described above is mounted and fixed onto a mother board, and then assembled to a predetermined apparatus. Hereinafter, description will be made briefly for a method and arrangement for mounting the display device 1 to the mother board, with reference to FIGS. 3 to 5.

Figure 3:
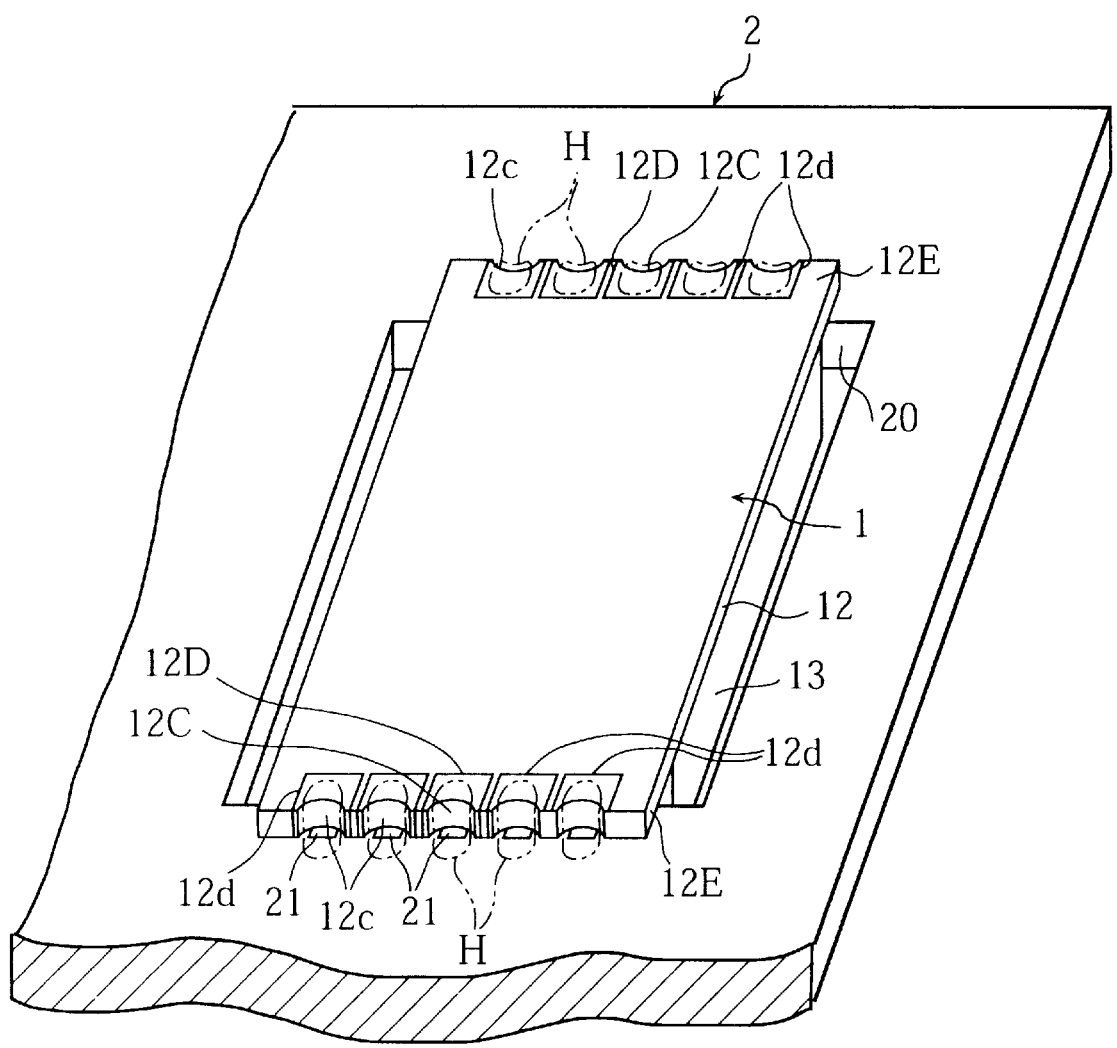
FIG. 3 is a perspective view from a lower surface side of the display device showing a state in which the display device is mounted to a mother board.
Figure 4:
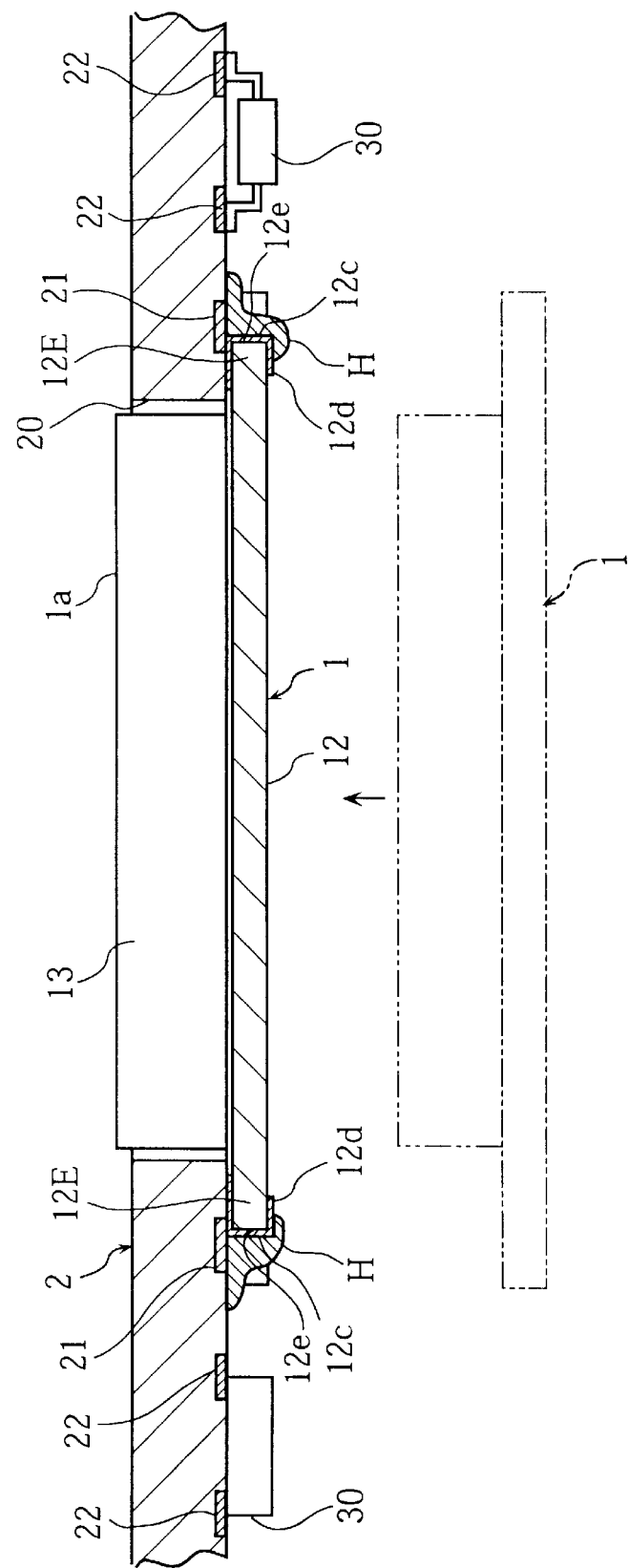
FIG. 4 is a longitudinal sectional views of the display device mounted to the mother board.
Figure 5:
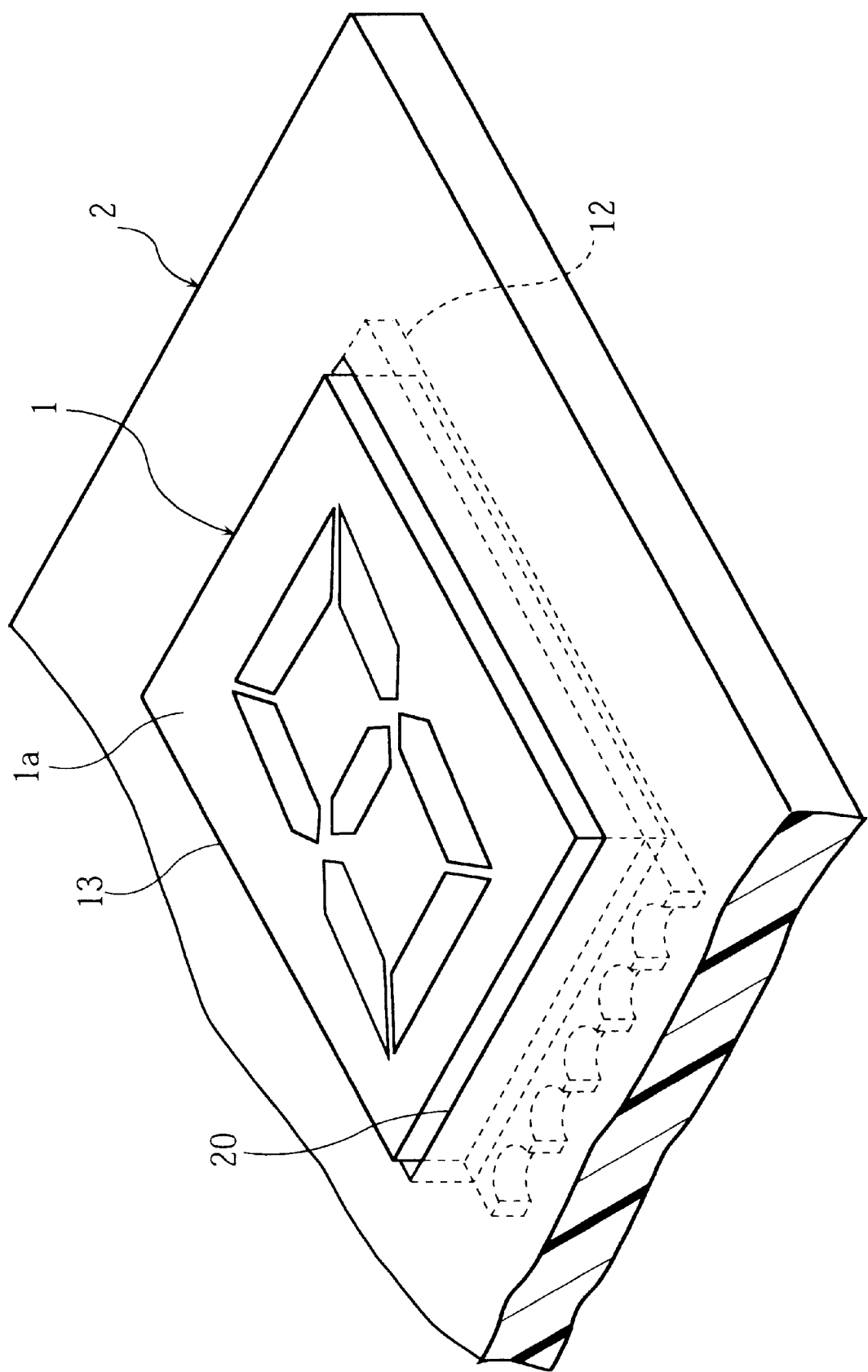
FIG. 5 is a perspective view of the display device mounted to the mother board.

As clearly shown in FIGS. 3 and 4, a mother board 2 is formed with a through hole 20 having an area size slightly larger than that of the reflecting case 13 as viewed from above. Thus, the through hole 20 can completely receive the reflecting case 13. The through hole 20 has edge portions in a lower surface of the mother board 2 formed with a total of ten terminal portions 21 each mating one of the recesses 12e when the display device 1 is mounted. It should be noted here that according to the present embodiment, the mother board 2 is formed with wiring pattern or terminal portions 22 only on the lower surface for mounting other electronic components 30.

With the above arrangement, the display device 1 is mounted as follows. Specifically, the display device 1 is aligned to the mother board 2, bringing each of the individual terminal portions 12c, 12d and the common terminal portions 12C, 12D conductive with each of the corresponding terminal portions 21 on the mother board 2. As shown in FIG. 4, such an alignment is achieved automatically by simply fitting the reflecting case 13 into the through hole 20. Since the through hole 20 has a longitudinal side shorter than that of the substrate 12, and since the substrate 12 has the extended edge portions 12E, each of the extending edge portions 12E of the substrate 12 is caught at an edge portion of the through hole 20.

Once the display device 1 has been aligned, the terminal portions 12c, 12d, 12C 12D are bonded by solder H to respective terminal portions 21 of the mother board 2. More specifically, each of the terminal portions 12c, 12d, 12C, 12D of the display device 1 or each of the terminal portions 21 of the mother board 2, or each of both, i.e. 12c, 12d, 12C, 12D and 21, is applied with cream solder in advance. Then, after the alignment is achieved, the mother board 2 is moved into a re-flow furnace for example for melting and then solidifying the solder H. If the above bonding operation is performed with at least the terminal portions 12c, 12d, 12C, 12D of the display device applied with the cream solder, the solder H will become continuous from the lower surface terminal portions 12d, 12D via the conductive portions 12c, 12C to the terminal portion 21 of the mother board 2 as clearly shown in FIGS. 3 and 4. It should be noted that according to the present embodiment, since the wiring pattern or terminal portions 22 for mounting other electronic components 30 are formed only on the lower surface of the mother board, it is possible to mount these other electronic components at the same time and by the same means as the mounting of the display device 1.

The mother board 2 mounted with the display device 1 as described above will look as shown in FIG. 5 when viewed from the upper surface side. Specifically, the display device 1 has its display surface 1a facing outward in the through hole 20. According to the present embodiment, since the reflecting case 13 has a thickness slightly greater than that of the substrate 12, the display device 1 projects slightly out of the upper surface of the mother board 2, as well as out of the lower surface of the mother board 2 by the thickness of the substrate 12. However, if the mother board 2 is thicker than the substrate 12, the reflecting case 13 will not project out of the upper surface of the mother board 2. Further, accords to the present embodiment the other electronic components are mounted only on the lower surface of the mother board 2. Thus, it is possible to avoid forming projections made by these other components, which also contributes to the reduction in the thickness of the as-mounted display device 1

In essence, according to the mounting arrangement as described above, the portion of the display device 1 projected out of the mother board 2 has a significantly reduced height as compared with the prior art. In the prior art the display device 1 is mounted on the upper surface of the mother board 2. Thus, an overall thickness of the mother board as mounted with the display device is significantly smaller than the prior art. Hence, even if the mother board 2 mounted with the display device 1 is to be assembled into an apparatus, the thickness of the as-mounted display device 1 may not be taken into consideration so strictly, and further the apparatus can now be thinner than before responding to market demand.

Further, since the portion of the display device 1 projecting out of the mother board 2 is thinner than that of the prior art, the display device 1 is less likely to interfere or contact with other members. This means that the display device 1 is now less susceptible to external impact, and therefore less prone to trouble such as a shorted circuit between the mother board 2 and the display device 1.

Further, according to the arrangement described above, the substrate 12 has a total of 10 bonds of solder H, i.e. a total of five solder bonds at each of the two end portions of the substrate 12. This provides the display device 1 with enough mechanical strength for attaching to the mother board 2, eliminating need for providing any other means to support the display device 1. In essence, establishing electrical connection between the substrate 12 and the mother board 2 by the solder H simultaneously provides sufficient mechanical hold by the solder H of the display device 1 to the mother board 2. Still further, such an operation of electrically and mechanically bonding the display device 1 can be completed by a very simple step of applying the cream solder in advance and making the cream solder re-flow.

Figure 6:
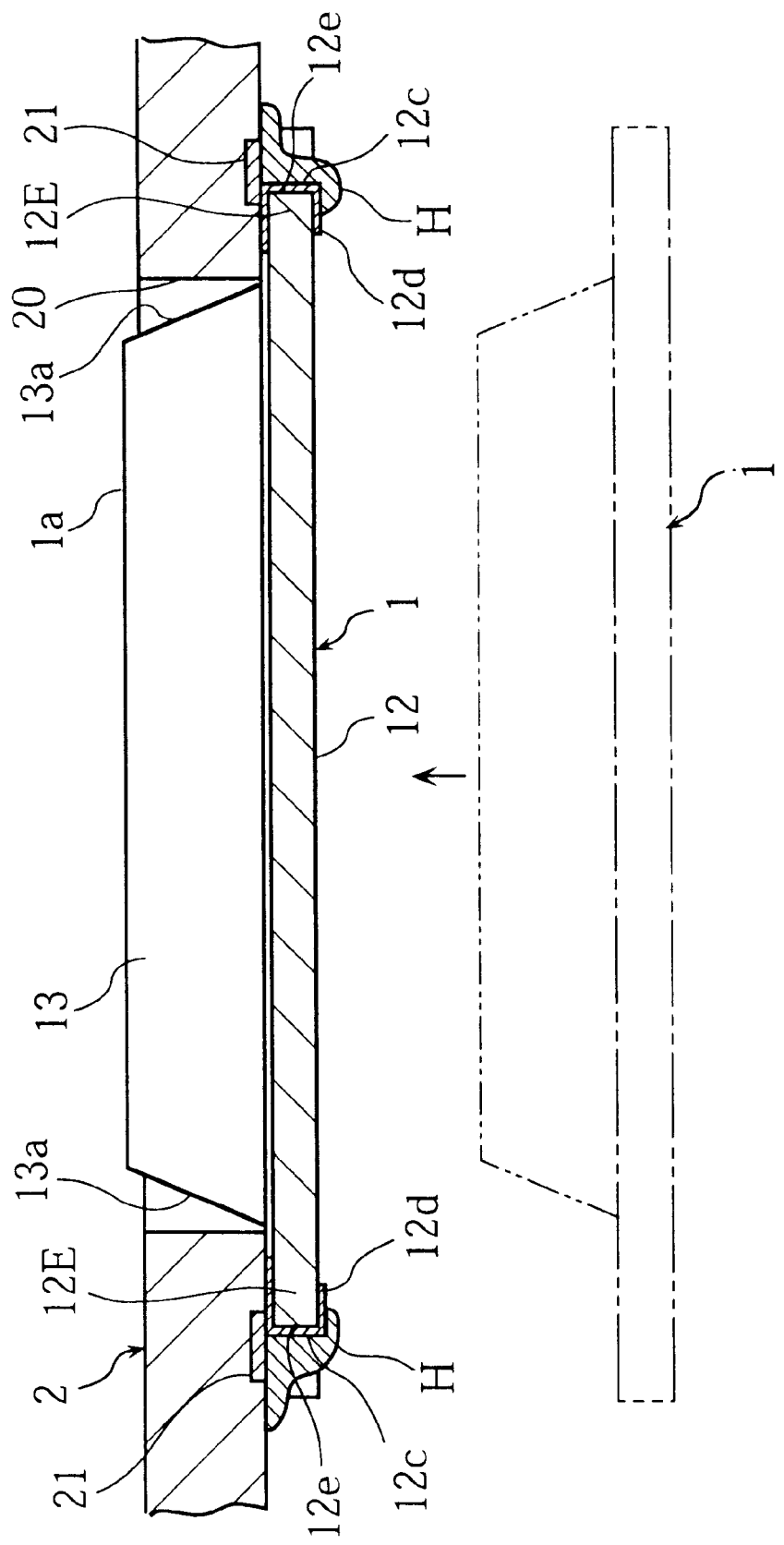
FIG. 6 is a longitudinal sectional view of another embodiment of the mounting arrangement for the display device according to the present invention.

FIG. 6 shows another embodiment of the display device mounting arrangement according to the present invention. A display device 1 according to this embodiment uses a reflecting case 13 having side surfaces each formed with a tapered portion 13a. All the other arrangements are exactly the same as the arrangement shown in FIGS. 1 and 2. Thus, according to this embodiment, the through hole 20 provided in the mother board 2 corresponds to a plan-view shape of the reflecting case 13. With such an arrangement for the display device 1, when the display device 1 is mounted to the mother board 2, the tapered portions 13a serves as a guide as shown an FIG. 6, introducing the reflecting case 13 into the through hole 20, providing advantage in automating the mounting operation of the display device 1 to the mother board 2.

Figure 7:
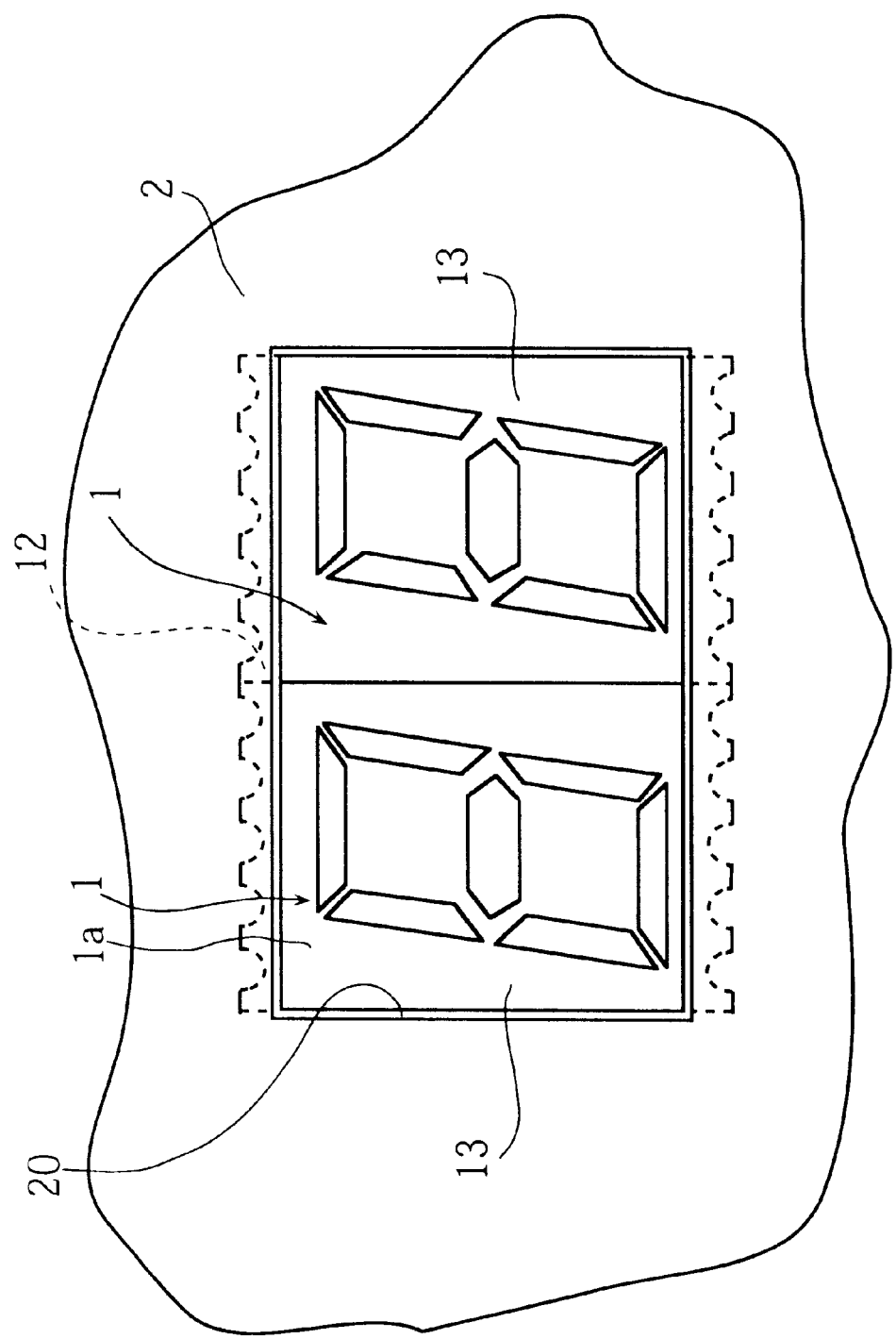
FIG. 7 is a plan view of still another embodiment of the mounting arrangement for the display device according to the present invention.
Figure 8:
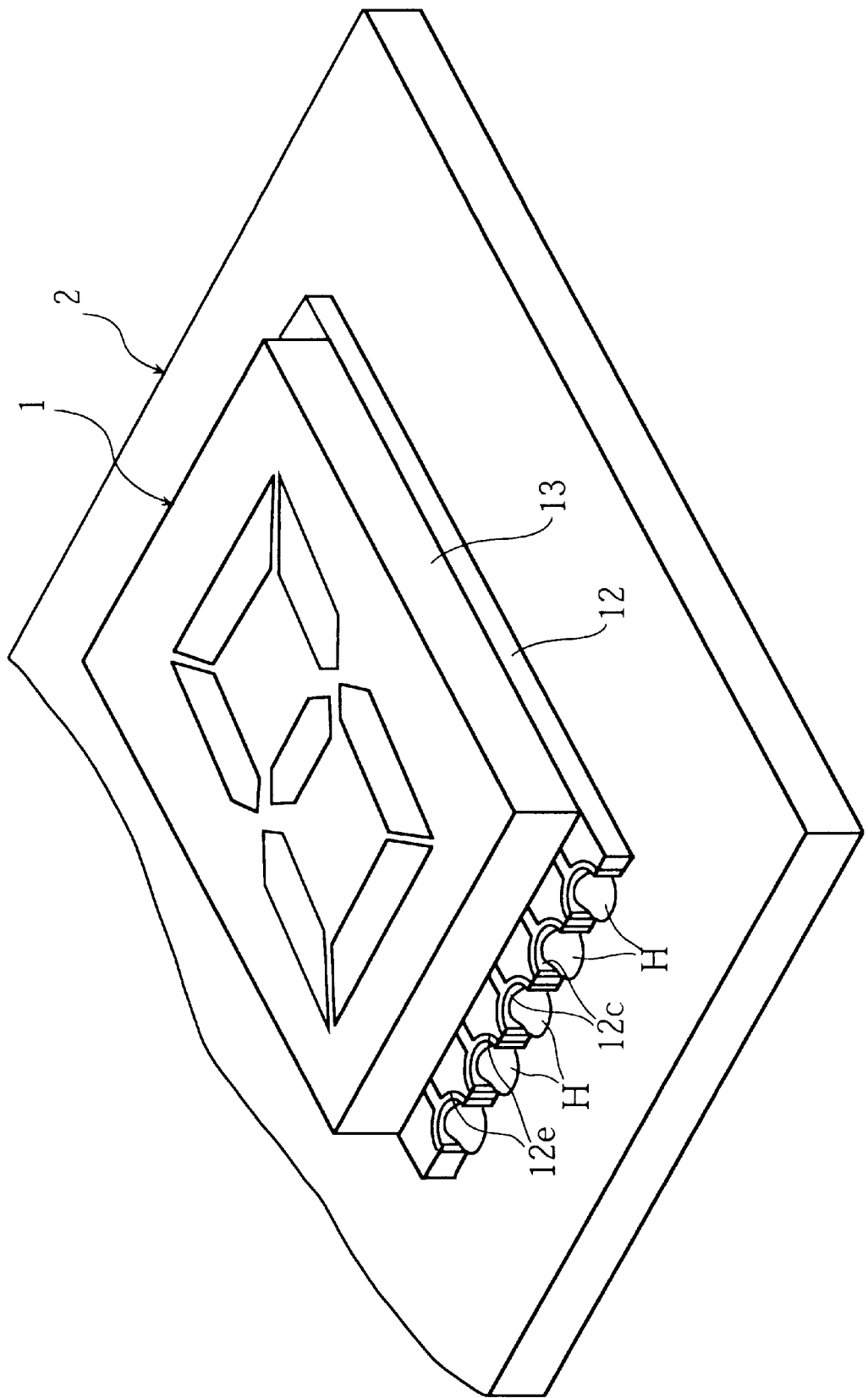
FIG. 8 is a perspective view of a prior art mounting arrangement of the display device.

FIG. 7 shows still another embodiment of the display device mounting arrangement according to the present invention. In this embodiment, a plurality of the display devices 1 shown in FIGS. 1 and 2 are mounted adjacently to each other in the mother board 2. The through hole 20 of the mother board 2 is formed large enough to receive the two reflecting cases 13, so that the reflecting cases 13 will be fully inserted into the through hole 20 of the mother board 2 when the display devices 1 are mounted. Thus, the same advantages as in each of the other embodiments described earlier can be obtained.

The present invention is of course not limited to the embodiments described above, and can be varied in many ways. For example, the display device 1 may alternatively be an eight-segment display device or a dot-matrix type display device.

Further, according to the present embodiments, the two end portions of the substrate 12 extend from the side edge of the reflecting case 13. However, the present invention is not limited by this, and can use the display device 1 of many different designs with the end portion of the substrate 12 extending from the reflecting case 13 for holding the display device 1 at an edge portion of the through hole 20.

Still further, variation may be made to the individual terminal portions 12c, 12d, common terminal portons 12C, 12D, as well as wiring patterns 12A, 12B for connecting the terminal portions 12c, 12d, 12C, 12D to respective light source pads 12a and wirebonding pads 12b.

I claim:

1. An arrangement for mounting a display device to a mother board; the display device comprising a substrate mounted with a plurality of light sources and having an edge portion formed with a plurality of terminal portions each connected with one of the light sources, and a reflecting case attached to the substrate and formed with window holes each at a location corresponding to one of the light sources:

wherein the mother board is formed with a through hole for receiving the reflecting case, having a lower surface formed with terminal portions, and wherein the display device has the reflecting case fitted into the through hole from a lower surface side of the mother board, with the terminal portions of the substrate electrically connected with respective terminal portions of the mother board.

2. The display device mounting arrangement according to claim 1, wherein the substrate of the display device has at least a portion extended from an edge of the reflecting case for being held by an edge portion of the through hole.

3. The display device mounting arrangement according to claim 2, wherein the terminal portions are formed in the extended portion, the substrate being electrically connected with the lower surface terminal portion of the mother board by solder, and the display device being mechanically held to the mother board by this solder.

4. The display device mounting arrangement according to claim 1, wherein the reflecting case has side surfaces each formed with a tapered portion for guiding the reflecting case into the through hole of the mother board.

5. The display device mounting arrangement according to claim 1, wherein a plurality of the display devices are mounted adjacently to each other.

6. The display device mounting arrangement according to claim 1, wherein the mother board is mounted with other electronic components only on the lower surface side thereof.

7. A method for mounting a display device to a mother board; the display device comprising a substrate mounted with a plurality of light sources and having an edge portion formed with a plurality of terminal portions each connected with one of the light sources, and a reflecting case attached to the substrate and formed with window holes each at a location corresponding to one of the light sources:

wherein the substrate further has at least a portion extended from an edge of the reflecting case, the reflecting case being fitted into a through hole formed in the mother board, with a display surface of the display device facing outward from the through hole, and the extended portion of the substrate holding the display device at an edge portion of the through hole for performing the rest of the mounting operations.

* * * * *